United States Patent [19]

Seshadri et al.

[11] Patent Number: 5,751,739
[45] Date of Patent: May 12, 1998

[54] METHODS OF AND DEVICES FOR ENHANCING COMMUNICATIONS THAT USE SPREAD SPECTRUM TECHNOLOGY

[75] Inventors: Nambirajan Seshadri; Carl-Erik Wilhelm Sundberg, both of Chatham, N.J.

[73] Assignee: Lucent Technologies, Inc., Murray Hill, N.J.

[21] Appl. No.: 236,744

[22] Filed: Apr. 29, 1994

[51] Int. Cl.⁶ .................................................. H03M 13/00
[52] U.S. Cl. .................................................. 371/30
[58] Field of Search ........................ 371/43, 44, 45, 371/46, 41, 39.1, 38.1, 37.1, 30

[56] References Cited

U.S. PATENT DOCUMENTS

| | | | |
|---|---|---|---|
| 5,197,061 | 3/1993 | Halbert-Lassalle et al. | 370/11 |
| 5,204,876 | 4/1993 | Bruckert et al. | 375/1 |
| 5,259,003 | 11/1993 | Berger et al. | 375/38 |
| 5,280,472 | 1/1994 | Gilhousen et al. | 370/18 |
| 5,287,374 | 2/1994 | Parr | 371/43 |
| 5,295,152 | 3/1994 | Gudmundson et al. | 375/1 |
| 5,329,547 | 7/1994 | Ling | 375/1 |
| 5,341,401 | 8/1994 | Farjh et al. | 375/94 |
| 5,383,219 | 1/1995 | Wheatley, III et al. | 375/1 |
| 5,396,516 | 3/1995 | Padovani et al. | 375/255 |
| 5,416,801 | 5/1995 | Chouly et al. | 375/260 |

FOREIGN PATENT DOCUMENTS

| | | |
|---|---|---|
| 0 490 552 | 6/1992 | European Pat. Off. |
| 0 634 840 | 1/1995 | European Pat. Off. |
| WO 92/17011 | 10/1992 | WIPO |

OTHER PUBLICATIONS

U.S. Patent Application Ser. No. 08/179831, filed Jan. 5, 1994, "Method and Apparatus For Prototype Waveform Speech Coding", filed by W. B. Kleijn.

K.S. Gilhousen et al., "On The Capacity Of A CDMA System," IEEE Transactions Of Vehicular Technology, vol. 40, No. 2, May 1991, pp. 303–312.

J. Hagenauer et al., "The Performance Of Rate Compatible Punctured Convolutional Codes For Digital Mobile Radio," Transactions on Communications 38(7), Jul. 1990, pp. 966–980.

C-E. Sundberg et al., "Digital Cellular Systems For North America," IEEE Global Telecommunications Conference & Exhibition, San Diego, CA, Dec. 1990.

A. Baier et al., *Multi–Rate DS–CDMA Radio Interface for Third–Generation Cellular Systems*, Seventh IEE European Conference on Mobile and Personal Communications, pp. 255–260, Dec. 13–15, 1993.

A. Baier et al., *Potential of CDMA for 3rd Generation Mobile Radio Systems*, MRC–Mobile Radio Conference, pp. 1–8, Nov. 13–15 1991.

Luca Cellario et al., *A VR–CELP Codec Implementation for CDMA Mobile Communications*, 1994 IEEE International Conference on Acoustics, Speech and Signal Processing, vol. 1, pp. 281–284.

Alfred Baier et al., *Design Study for a CDMA-BAsed Third–Generation Mobile Radio System*, IEEE Journal on Selected Areas in Communications, vol. 12, No. 4, pp. 733–743, May 1994.

Peter Hoeher, *Unequal Error Protection for Digital Mobile DS–CDMA Radio Systems*, Institute of Electrical and Electronics Engineers, vol. 3, pp. 1236–1241, May 1–5, 1994.

*Primary Examiner*—Stephen M. Baker

[57] ABSTRACT

We have invented methods of and devices for introducing unequal error protection into spread spectrum communication systems. One embodiment of the invention addresses certain inefficiencies of the standard known as IS-95 used, for example, in some mobile direct sequence code division multiple access ("DS-CDMA") phone systems. The invention allows for increased system capacity and/or improved quality. More specifically, spread spectrum multiple access ("SSMA") coding may be combined with the concept of unequal error protection ("UEP"), resulting in an UEP SSMA coding process. IS-95, in order to make significant portions of a signal highly immune to errors, has imposed the same high degree of error immunity on less significant portions of the signal (when, in fact, a lower degree would suffice) and, thus, wastes bandwidth. The present invention's coding process (i.e., UEP SSMA) utilizes bandwidth in a closer to optimal manner than known methods.

44 Claims, 6 Drawing Sheets

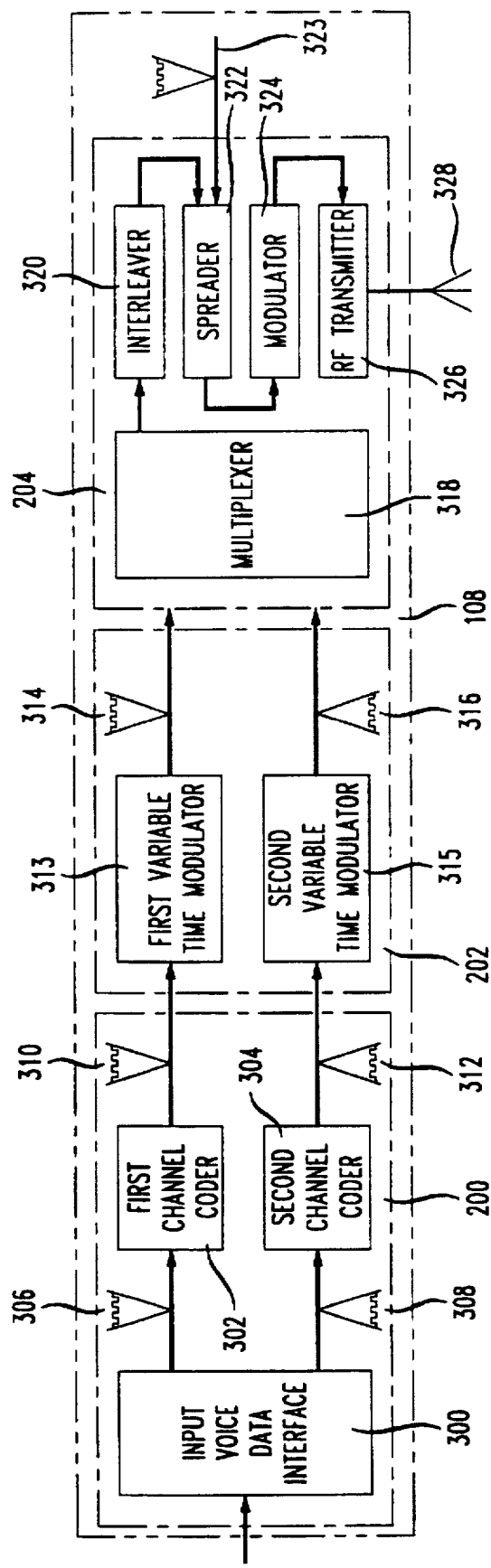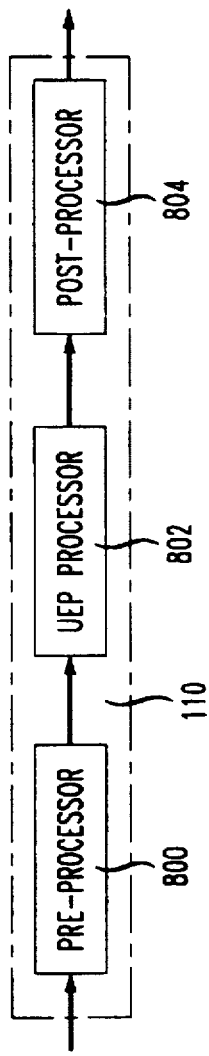

METHODS OF AND DEVICES FOR ENHANCING COMMUNICATIONS THAT USE SPREAD SPECTRUM TECHNOLOGY

FIELD OF THE INVENTION

The present invention relates generally to communication of signals with use of spread spectrum (SS) technology. More specifically, the present invention relates to improving spread spectrum system capacity and/or transmission quality.

BACKGROUND OF THE INVENTION

Spread spectrum multiple access (SSMA) techniques are attracting widespread attention in the personal communication fields, such as, for example, digital cellular radio. In SSMA systems, both the time and frequency domains may be shared by multiple users simultaneously. This simultaneous sharing of time and frequency domains is to be distinguished from time-division and frequency-division multiple access systems, TDMA and FDMA, where multiple user communication is facilitated with use of unique time slots or frequency bands, respectively, for each user.

In SSMA systems, such as direct-sequence code division multiple access (DS-CDMA) cellular systems, a base station may simultaneously transmit distinct information signals to separate users using a single band of frequencies. Individual information signals simultaneously transmitted in one frequency band may be identified and isolated by each receiving user because of the base station's utilization of a unique spreading sequence in the transmission of each information signal. Prior to transmission, the base station multiplies each information signal by a spreading sequence signal assigned to the user intended to receive the signal. This multiplication, performed by a "spreader," "spreads" the spectrum of the information signal over a "wide" frequency band shared by all users. To recover the correct signal from among those signals transmitted simultaneously in the wide frequency band, a receiving mobile user multiplies a received signal (containing all transmitted signals) by its own unique spreading sequence signal and integrates the result. These operations are performed by a "despreader." By so doing, the user "despreads" the received signals and identifies that signal intended for it, as distinct from other signals intended for other users.

The Telecommunications Institute of America ("TIA") recently adopted a SSMA standard that implements DS-CDMA technology. Telecommunications Institute of America, "Mobile Station-Base Station Compatibility Standard for Dual-Mode Wideband Spread-Spectrum Cellular System," 1993 (published as IS-95). This standard is called IS-95. However, we have recognized that spread spectrum systems, such as that described in the IS-95 standard, process certain signals inefficiently. This inefficient processing results in reduced system capacity and/or signal quality.

SUMMARY OF THE INVENTION

We have invented a spread spectrum transmission technique which allows for increased system capacity and/or improved signal quality. These benefits are obtained by employing unequal error protection (UEP) in a spread spectrum system.

In accordance with illustrative embodiments of the present invention, a signal to be communicated by a spread spectrum system multiple access system comprises at least two portions having differing levels of significance relative to each other. Illustratively, these differing levels of significance reflect differing levels of sensitivity to signal errors. A first of these portions represents information which is relatively sensitive to signal errors suffered in transmission, while a second of these portions represents information which is relatively insensitive to such signal errors. Because of this difference in relative error sensitivity, these portions are processed with distinct error protection processes which supply greater and lesser degrees of error protection, respectively, to these portions.

Embodiments of the present invention make efficient use of available channel bandwidth because, unlike conventional spread spectrum systems employing error protection (such as the IS-95 standard), the embodiments tailor error protection capability to signal error sensitivity. The IS-95 standard, for example, employs an error protection process which is suitable to the most error-sensitive portion (s) of the signal. Thus, IS-95 provides a degree of error protection to some portions of the signal which exceeds that which is needed for such portions. This excessive degree of error protection (sometimes referred to as "overcoding") wastes channel bandwidth.

The present invention, on the other hand, utilizes channel bandwidth in a more efficient manner through a tailored approach to error protection. Thus, for a given channel bandwidth, the present invention affords greater system capacity. For a given channel bandwidth and a given number of users, the present invention affords enhanced communicated signal quality. Naturally, embodiments of the present invention may provide both enhanced system capacity and enhanced signal quality.

An example of a signal exhibiting at least two portions having differing levels of significance relative to each other is a compressed speech signal. As is well known in the art of speech compression, a compressed speech signal comprises a sequence of frames, wherein each frame typically represents 20–30 ms of uncompressed speech. A frame of compressed speech comprises a set of bit-fields. Each such bit-field represents parameters needed to reconstruct speech from the compressed frame. For example, these bit-fields typically represent parameters such as linear prediction coefficients, pitch, codebook indices, and codebook gains. In the context of the present invention, these bit-fields are illustrative portions of the compressed speech signal which have differing levels of significance. Another example of a signal which includes portions having differing levels of significance is a signal which represents distinct types of information, such as audio information and alphanumeric information. In this case, the audio portion and the alphanumeric portion have different levels of significance. Thus, the present invention may be applied to signals such as these to enhance SS system capacity and/or quality.

Those of ordinary skill in the art will appreciate that the principles of the present invention are applicable to a wide variety of SS signals and systems. For example, the present invention may be applied to provide tailored error protection capability where the signal to be communicated includes more than two portions of differing sensitivity to errors (e.g., a signal may include a first portion(s) which is (are) relatively sensitive to signal errors, a second portion(s) which is (are) relatively moderately sensitive to signal errors, and a third portion(s) which is (are) relatively insensitive to signal errors). While the illustrative embodiments of the present invention concern a DS-CDMA, the present invention is applicable to systems which employ other SS communication techniques (including frequency hopping ("FH" systems, time hopping ("TH") systems, chirp systems and single user versions of the other above-mentioned multiple access systems). In addition, though the illustrative embodiments concern a wireless communication channel of the type addressed by the IS-95 standard, the present invention may be applied to SSMA systems with other types of channels such as, for example, optical fiber channels, cable transmission channels, infrared wireless channels, and optical free space channels.

BRIEF DESCRIPTION OF THE DRAWINGS

FIG. 3 presents a detailed block diagram of the illustrative UEP DS-CDMA encoder of FIG. 2.

FIG. 8 presents a block diagram of a second illustrative UEP DS-CDMA decoder for use in conjunction with the UEP DS-CDMA encoder of FIG. 6.

DETAILED DESCRIPTION OF THE ILLUSTRATIVE EMBODIMENTS

The "Detailed Description" will be described in a wireless UEP DS-OM telephony application environment showing only one base station for purposes of simplicity. However, those skilled in the art will appreciate that the present invention may be used with many different types of SS systems, many different types of applications, and/or many different types of channels.

The illustrative embodiments of the invention are presented in the context of communicating compressed speech signals. As is well known in the art of speech compression, a compressed speech signal comprises a sequence of frames, wherein each frame typically represents 20-30 ms of uncompressed speech. A frame of compressed speech comprises a set of bit-fields. Each such bit-field represents parameters needed to reconstruct speech from the compressed frame. For example, these bit-fields typically represent parameters such as linear prediction coefficients, pitch, codebook indices, and codebook gains. See U.S. patent application Ser. No. 08/179831, of B. Kleijn entitled "Method and Apparatus for Prototype Waveform Speech Coding," which is assigned to the assignee of the present invention. In the context of the present invention, these bit-fields are illustrative portions of the compressed speech signal which have differing levels of significance. The bit-field representing pitch is an example of a more significant portion of the signal as opposed to some other bit-fields of the frame. The packing and unpacking of bit-fields in speech coding are conventional in the art. For clarity of explanation of the embodiments, therefore, no details of the packing and unpacking of bit-fields (illustrative "portions") will be presented.

For clarity of explanation, the illustrative embodiments of the present invention are presented as comprising individual functional blocks (including functional blocks labeled as "processors"). The functions these blocks represent may be provided through the use of either shared or dedicated hardware, including, but not limited to, hardware capable of executing software. Use of the term "processor" should not be construed to refer exclusively to hardware capable of executing software.

Illustrative embodiments may comprise digital signal processor (DSP) hardware, such as the AT&T DSP16 or DSP32C, read-only memory (ROM) for storing software performing the operations discussed below, and random access memory (RAM) for storing DSP results. Very large scale integration (VLSI) hardware embodiments, as well as custom VLSI circuitry in combination with a general purpose DSP circuit, may also be provided.

Figure 1:
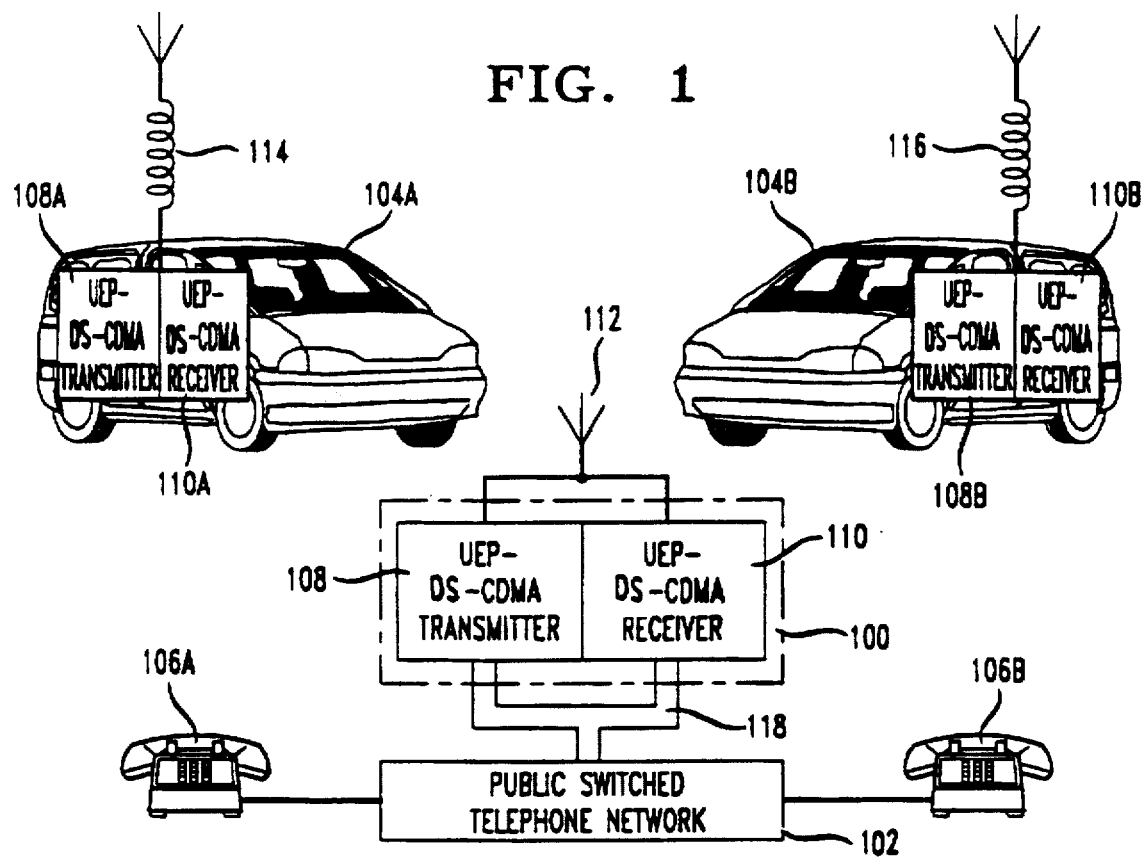
FIG. 1 presents an illustrative system in which a UEP DS-CDMA coding process is implemented.

FIG. 1 shows a system in which the UEP-DS-CDMA coding scheme may be implemented. The system includes a base station 100, a public switched telephone network 102 ("PSTN 102"1), a plurality of mobile units, e.g., 104a and 104b, and a plurality of stationary units, e.g., 106a and 106b. Base station 100 includes a UEP-DS-CDMA transmitter 108, a UEP-DS-CDMA receiver 110, and an antenna 112. Mobile unit 104a includes a UEP-DS-CDMA transmitter 108a, a UEP-DS-CDMA receiver 110a, and an antenna 114. Mobile unit 104b includes a UEP-DS-CDMA transmitter 108b, a UEP-DS-CDMA receiver 110b, and an antenna 116. Mobile units 104a and 104b may, for example, communicate with stationary units 106a and 106b via the base station 100, a link 118 between the base station 100 and the PSTN 102, and the PSTN 102.

Again referring to FIG. 1, if a first person in mobile unit 104a desires to talk with a second person located at stationary unit 106a, the first person places a call. The UEP-DS-CDMA transmitter 108a encodes and transmits signals representative of the first person's voice. The UEP-DS-CDMA receiver 110 of the base station 100 receives and decodes the signal representative of the first person's voice. Next, the UEP-DS-CDMA transmitter 110 takes the decoded voice and transmits it to stationary unit 106a. Voice signals from the second person to the first person would also be sent via the PSTN and base station 100. Thus, the first person and the second person are able to communicate.

Those skilled in the art will realize that although only one type of communication has been described, there are many other manners of communicating in which the present invention may be used. For example, mobile unit 104a may wish to communicate with another mobile unit 104b. This may require more than one base station if, for instance, the mobile units are far apart. Further, the present invention may be used to transmit/receive communications wherein satellites are involved. Additionally, the present invention may be used in systems wherein information other than signals representing voice are transmitted and received. For example, one may transmit/receive data relating to other audio signals, video signals, audio-video signals, and other types of signals. All this having been mentioned, we will now focus upon how UEP may be applied in a UEP-DS-CDMA system for voice communications.

Figure 2:
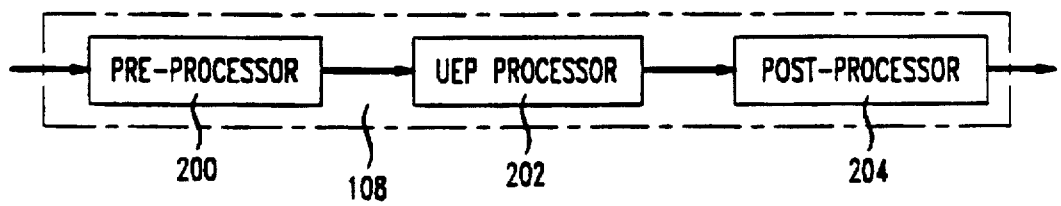
FIG. 2 presents a block diagram of an illustrative UEP DS-CDMA encoder made in accordance with the present invention.

FIG. 2 shows a block diagram of a UEP-DS-CDMA transmitter 108. The UEP-DS-CDMA transmitter 108 includes a pre-processor 200, a UEP processor 202, and a post-processor 204.

FIG. 2 may be implemented in a variety of manners. For instance, FIG. 2 may be implemented using a variable time ("VT") UEP method, a variable code ("VC") UEP method, or a variable power ("VP") UEP method. Also, FIG. 2 may be implemented using combinations of the above three methods. However, a common thread amongst the above methods is that they all apply a first error protection process to a set of more significant portions of a signal and a second error protection scheme to a set of less significant portions of the signal. Further, since the first error protection scheme provides a greater amount of error protection than the second error protection scheme, unequal error protection, or UEP, is achieved within the DS-CDMA coding scheme.

After describing the VT method that may be used in the framework of the UEP-DS-OM transmitter 108 shown in FIG. 2, a corresponding UEP-DS-C receiver using VT methods will be described. Next, a VC method that may be used in the framework of the UEP-DS-CDMA transmitter 108 shown in FIG. 2, a corresponding UEP-DS-AM receiver using VC methods will be described. Next, a VP method that may be used in the framework of the UEP-DS-OM transmitter 108 shown in FIG. 2, a corresponding UEP-DS-CDMA receiver using VP methods will be described. Finally, combinations of the VT, VP, and VC methods will be briefly described.

1. UEP-DS-CDM Transmitter: The VT UEP method and device

FIG. 3 shows a detailed block diagram of a UEP-DS-CDMA transmitter 108 that may be used with the VT method. The preprocessor processor 200, the UEP processor 202, and the post-processor 204 will be described in order.

The pre-processor comprises input voice data interface 300, a first channel coder 302, and a second channel coder 304. The interface 300 may use any one of a number of voice compression techniques. However, it serves to input voice data. Interface 300 separates voice data into two data streams of unequal significance. The relevance of the unequal significance to UEP will be described in detail later. A first data stream 306 (e.g., a more significant data stream) is input into the first channel coder 302 and a second data stream 308 (e.g., a less significant data stream) is input into the second channel coder 304. The first channel coder 302 and the second channel coder 304 essentially serve to build redundancies into the first data stream 306 and the second data stream 308 to form a first channel coded data stream 310 and a second channel coded data stream 312, respectively. The first channel coded data stream 310 and the second channel coded data stream 312 are input into the UEP processor 202.

The UEP processor 202 takes, as its inputs, the first channel coded data stream 310 and the second channel coded data stream 312 and uses a first variable time modulator 313 and a second variable time modulator 315. The variable time modulators, 313 and 315, generate a first time modulated signal 314 and a second time modulated signal 316, respectively, from the first channel coded data stream 310 and the second channel coded data stream 312, respectively. The first time modulated signal 314 and the second time modulated signal 316 are then processed further in the post-processor 204.

The post-processor 204 takes, as its inputs, the first time modulated signal 314 and the second time modulated signal 316 and outputs an RF signal representing voice data input by the means for inputting voice data 300. The post-processor comprises a multiplexer 318, an interleaver 320, a spreader 322, a modulator 324, a radio frequency ("RF") transmitter 326, and an antenna 328, all connected as shown. The multiplexer 318 functions to combine the first time modulated signal 314 and the second time modulated signal 316. The combined signal is then interleaved by the interleaver 320. The processing that occurs in the multiplexer 318, the spreader 322, the modulator 324 and the RF transmitter 326 is the type of processing typical of DS-CDMA systems known to those skilled in the art. For example, the spreader 322 takes as one input a spreading sequence 323. The type of processing that occurs in the interleaver 320 will be discussed later.

Referring to FIG. 3, the input voice data interface 300 separates the signal, e.g., voice data, into the first data stream 306 and the second data stream 308. The first data stream 306 comprises at least one "more" significant portion of the voice data and the second data stream comprises at least one "less" significant portion of the voice data. The at least one more significant portion is also referred to as a first segment. The at least one less significant portion is also referred to as a second segment. The interface 300 performs this separation based upon the significance of the time portion of the voice data. The first segment of the signal is said to be more significant than the second segment of the signal if, for example, the first segment is more sensitive to transmission errors. The first segment and the second segment may either be digital or analog. Thus, for example, the first data stream 306 may comprise information bits that are deemed to be more significant than the second data stream 308. In this situation, the first segment and the second segment may be referred to as a set of more significant bits and a set of less significant bits, respectively.

FIGS. 4a through 4f and 4h show how a signal is processed by the encoder shown in FIG. 3, through the variable time modulators, 313 and 315. As an example, FIGS. 4a and 4b show both the first data stream 306 and the second data stream 308 as being two bits in length. The first channel coder 302 and the second channel coder 304 are each rate one-half coders. Therefore, when processed by the coders 302, 304, the number of bits in streams 306 and 308 are doubled at the output of coders 302, 304 (see, e.g., FIGS. 4c and 4d). Although the first channel coder 302 and second channel coder 304 are of the same rate, the reason why two distinct channel coders are used is to provide a clear demarcation between the more significant portions and the less significant portions. In order to maintain this demarcation, two channel decoders will be used in the receiver 110.

When shown in the time domain (FIG. 4a and 4b), the first data stream 306 and the second data stream 308 are each eight basic time units long. A "basic time unit" is the longest time interval, $T_0$, such that "stretched" bits (see FIG. 4e and accompanying discussion below) representing the first segment and "compressed" bits (see FIG. 4f and accompanying discussion below) representing the second segment are integer multiples of $T_0$. Thus, if UEP were not used, the information shown in FIGS. 4a and 4b would be, collectively, sixteen basic time units long (as opposed to splitting the sixteen basic time units of bits into eight more important basic time units of bits and eight less important basic time units of bits). More generally, the first data stream 306, comprising a set of more significant bits, is represented in a first time portion 350 (e.g., eight basic time units). The second data stream 308, comprising a set of less significant bits, is represented in a second time portion 352 (e.g., eight basic time units). At least one of these time portions, 350 and/or 352, is time modulated. Once processed by the first channel coder 302 and second channel coder 304, the set of more significant bits would be time modulated to increase (e.g., stretch) the first time portion or the set of less significant bits would be time modulated to decrease (e.g., compress) the second time portion, respectively, or both. The result of the time modulation is called a modulated frame 354, as shown in FIG. $4_h$. While the modulated frame 354 is shown, for simplicity, as being generated from a four bit frame (see FIGS. 4a and 4b), typically, frames comprise significantly more bits than four, as is apparent to those skilled in the art.

Referring to FIGS. 4c and 4d, the first channel coded data stream 310 and the second channel coded data stream 312 are shown, respectively. In this example, the first channel coder 302 and the second channel coder 304 take the first data stream 306 and the second data stream 308, respectively, and use two bits to represent each information bit therein. Thus, both FIGS. 4c and 4d are shown as having four bits each. When twice as many bits occur in the first and second channel coded data streams 310 and 312 as compared to the first and second data streams, the first and second channel coders 302 and 304 are referred to as "rate ½ coders." Another example would be one wherein the first and second channel coded data streams had three times as many bits as the first and second data streams. In this example, the first and second channel coders are "rate ⅓ coders."

Referring to FIGS. 4e through 4h, the effect of time modulation is shown. FIGS. 4e and 4f show the first time modulated signal 314 and the second time modulated signal 316, respectively. Although the first and second time modulated signals, 314 and 316, represent two original bits (see FIGS. 4a and 4b), the first time modulated signal 314 and the second time modulated signal 316 are shown as being twelve and four basic time units in length, respectively, as shown in FIG. 4h, instead of eight time bits each as shown in FIG. 4g.

If time modulation were not performed, an input to the spreader 322 would look similar to FIG. 4g wherein the first channel coded data stream 310 and the second channel coded data stream 312 are combined. In fact, in this situation, one would most likely have only one channel coder, not two, and there would be no need for the multiplexer 318. Further, in this situation, even if the bits of FIG. 4a were more significant than the bits of FIG. 4b (unbeknownst to the channel coder), the two bits shown in FIG. 4a would have eight basic time units devoted to them prior to being input into the spreader 322. Also, the two bits shown in FIG. 4b would have eight basic time units devoted to them prior to being input into the spreader 322.

Figure 4:
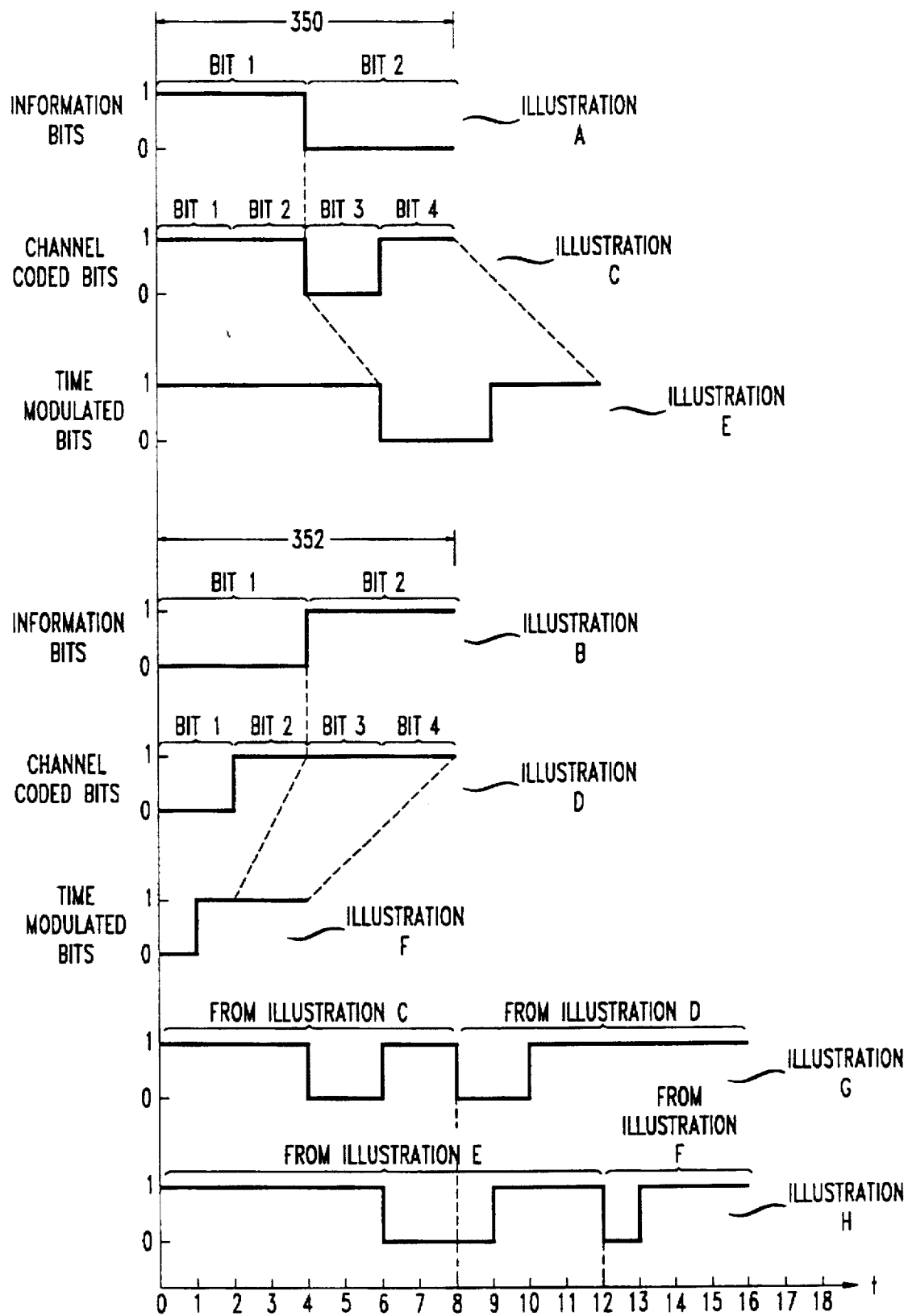
FIGS. 4a through 4h present how a signal is processed by the illustrative UEP DS-CDMA encoder of FIG. 3 as compared with a CDMA encoder without UEP.

However, when time modulation is performed, preferably, it has the effect of "stretching" the more significant bits and "compressing" the less significant bits as determined by the interface 300. Time modulators 313, 315 may be implemented in software by conventional time-index scaling procedures. Illustratively, the number of basic time units used to represent a more significant bit is greater than the number of basic time units to represent a less significant bit. Those skilled in the art will realize, however, that the processing of the signal shown in FIG. 4 is only exemplary and that one could:

(a) use a single channel coder that is time-shared between the more significant bits and the less significant bits;

(b) use no channel coder, in which case the more significant bits and less significant bits would be input directly into, e.g., the first variable time modulator 313 and the second variable time modulator 315;

(c) have more than two levels of significant bits (e.g., a first, second and third level of significance) wherein each level has a different amount of error protection provided to it;

(d) have the first channel coder 302 be of a given rate and the second channel coder 304 be the same rate (but not necessarily each being a rate ½ coder);

(e) have any percentage of the bits (as opposed to 500 shown in FIG. 4) be deemed "more significant" depending upon the application and the capabilities of the interface 300;

(f) stretch the more significant bits while leaving the less significant bits unchanged or compress the less significant bits while leaving the more significant bits unchanged; and/or (g) combinations of the above that do not conflict such as "(e)" and "(f)".

Preferably, the interleaver 320 symbol length is the basic time unit and thus, the interleaver 320 operates upon each basic time unit of the signal shown in FIG. 4h. However, those skilled in the art will realize that one could have the interleaver 320 operate on symbols wherein the symbol length is the length of:

(a) a chip, wherein a chip may be defined as the time associated with one symbol unit of the direct sequence spreading sequence and wherein the interleaving process performed by the interleaver 320 is performed subsequent to the spreading function of the spreader 322;

(b) a multiple integer of a chip or the basic time unit; and/or (c) non-integer multiples of the chip or the basic time unit.

Also, the interleaver 320 may interleave its input signal maintaining the variable symbol time lengths of the individual stretched and compressed bits represented by FIGS. 4e and 4f, regardless of whether the stretched and compressed bits have a common basic time unit. Although in the case of using no channel coders interleaving may not be required, interleaving over the basic time unit provides extra protection against fading.

The output of the interleaver goes into the spreader 322. The spreader 322 represents a typical spreader for DS-CDMA applications as described in K. S. Gilhousen, I. M. Jacobs, R. Padovani, A. J. Viterbi, L. A. Weaver, Jr., and C. E. Wheatley III, "On the Capacity of a Cellular CDMA System," IEEE Transactions of Vehicular Technology, vol. 40, No. 2, 303–312 (May, 1991) (hereinafter "the Gilhousen et al. article"). The modulator 324, the RF transmitter 326, and the antenna 328 are also typical of such elements as mentioned in the Gilhousen et al. article.

Preferably, for the case of orthogonal transmission using, e.g., Walsh functions (see the Gilhousen et al. article), a Walsh modulator based upon, e.g., the basic time unit, $T_0$, is, for example, interposed between the UEP DS-OM transmitter's interleaver 320 and spreader 322. Also, the first channel coder 302 and the second channel coder 304 may be convolutional coders or block coders. The interleaver 320 may be a block interleaver or a convolutional interleaver. Standard timing signals are provided inside the transmitter, e.g., 108 of FIG. 1, for the relevant units. Orthogonal transmission and standard timing signals may also be used with VC transmitters and VP transmitters which are

2. UEP-DS-CDMA Receiver: The VT UEP method and device

Figure 5A:
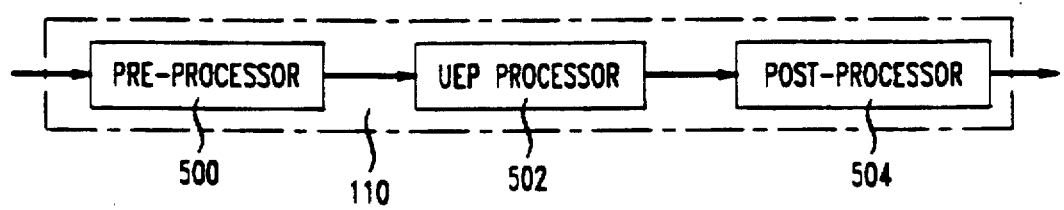
FIG. 5a presents a detailed block diagram of an illustrative UEP DS-CDMA decoder of FIG. 5.
Figure 5B:
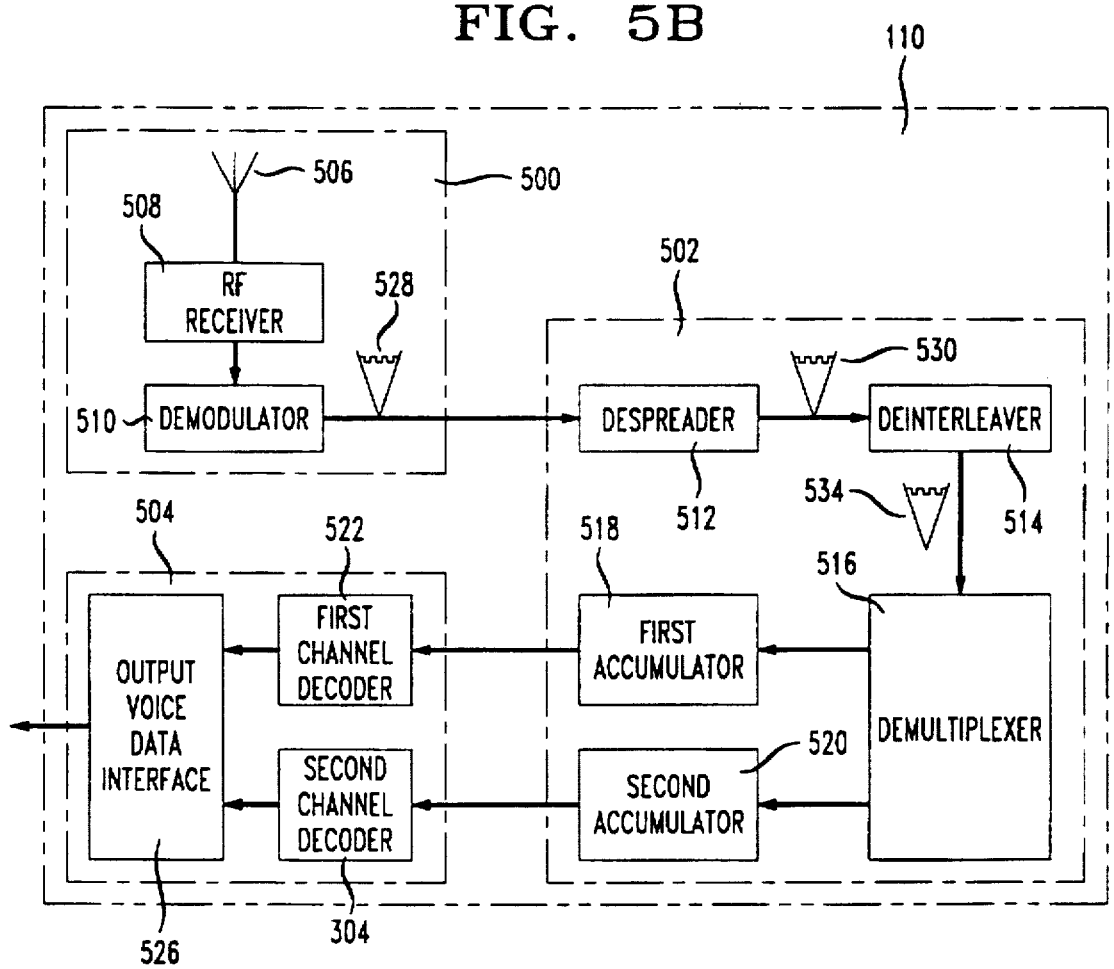
FIG. 5 presents a block diagram of an illustrative UEP DS-CDMA decoder for use in conjunction with the UEP DS-CDMA encoder of FIG. 3.

FIG. 5 shows a block diagram of a UEP-DS-CDMA receiver 110. The UEP-DS-CDMA receiver 110 comprises a pre-processor 500, a UEP processor 502, and a post-processor 504. The pre-processor 500, the UEP processor 502, and the post-processor 504 will be described in order with reference to FIG. 6 which shows a receiver that may be used with the transmitter of FIG. 3.

Referring to FIG. 5a, the pre-processor 500 comrprises an antenna 506, an RF receiver 508, and a demodulator 510 all connected as shown. The output of the demodulator 510 is input into the UEP processor 502.

The UEP processor comprises a despreader 512, a deinterleaver 514, a demultiplexer 516, a first accumulator 518, and a second accumulator 520, all connected as shown. Those skilled in the art are familiar with how to implement conventional synchronization and timing schemes associated with DS-CDMA systems. See the Gilhousen et al. article. These synchronization and timing schemes have already been applied in the pre-processor 500 and thus, the UEP processor receives properly timed and synchronized signals ("the timed signals").

The despreader 512 receives a signal 528 and outputs a despread signal 530. The despreader 512 accomplishes this function by correlating the signal 528 with the spreading sequence 532 over each basic time unit. The despread signal 530 represents analog values that, when properly combined, form a series of soft decision values. The manner in which these analog values may be combined will now be explained.

The deinterleaver 514 receives the despread signal 530 and outputs a deinterleaved signal 534. The deinterleaver 514 thus functions to perform an inverse operation of that performed by the interleaver 320 of the transmitter 108. Thus, the order of the basic time units of the signal input into the interleaver 320 is restored. However, the amplitude of the signal in the receiver 110 is, in general, analog, thus deinterleaver 514 performs "soft" deinterleaver operations.

The demultiplexer 516 receives the deinterleaved signal 534 and outputs a first set of time domain portions corresponding to the set of more significant bits and a second set of time domain portions corresponding to the set of less significant bits. Both the first set and second set of time domain portions comprise analog values that were represented by the despread signal 530.

The first accumulator 518 receives the first set of time domain portions. The first accumulator 518 operates upon the analog value associated with each basic time unit for each stretched bit. For example, in FIG. 4e, there are three analog values per stretched bit since each stretched bit occupies three basic time units. These analog values are added together, resulting in a soft decision value for each stretched bit. Once this is done for all of the stretched bits, it results in a series of soft decision values representing the first set of time domain portions.

The second accumulator 520 receives the second set of time domain portions. The second accumulator 520 operates upon the analog value associated with each basic time unit for each compressed bit. For example, in FIG. 4f, there is one analog value for each compressed bit since each stretched bit occupies one basic time unit. Although in general analog values are added together as discussed with reference to FIG. 4e, no addition is necessary in the special case of only one analog value per compressed bit as shown in FIG. 4f. This results in a soft decision value for each compressed bit. Once this is done for all compressed bits, it results in a series of soft decision values representing the second set of time domain portions.

The post-processor comprises a first channel decoder 522, a second channel decoder 524, and an output voice data interface 526. Preferably, the first channel decoder 522 and the second channel decoder 524 are Viterbi decoders (as are the other channel decoders, preferably, discussed throughout). Also preferably, these channel decoders, e.g., 522, correspond to memory 6, 7, or 8 coders (i.e., 6, 7, or 8 bits are used in the convolutional encoding process). The first channel decoder 522 decodes the soft decision values representing the first set of time domain portions to recover a representation of the first data stream 306. The second channel decoder 524 decodes the soft decision values representing the second set of time domain portions to recover a representation of the second data stream 308. The representations of the first data stream 306 and the second data stream 308 are input into the interface 526.

Those skilled in the art will appreciate the variations that one must make in the receiver 110 depending upon variations made in the transmitter 108 (as described in section "1." above). For example, if no channels coders are used, there are no channel decoders. Symbol by symbol decisions would be made. Also for example, if one channel coder is used, using one channel decoder that changes symbol timing from the first time portion to the second time portion may be used.

3. The UEP-DS-AM Transmitter: The VC UEP method and device

Figure 6:
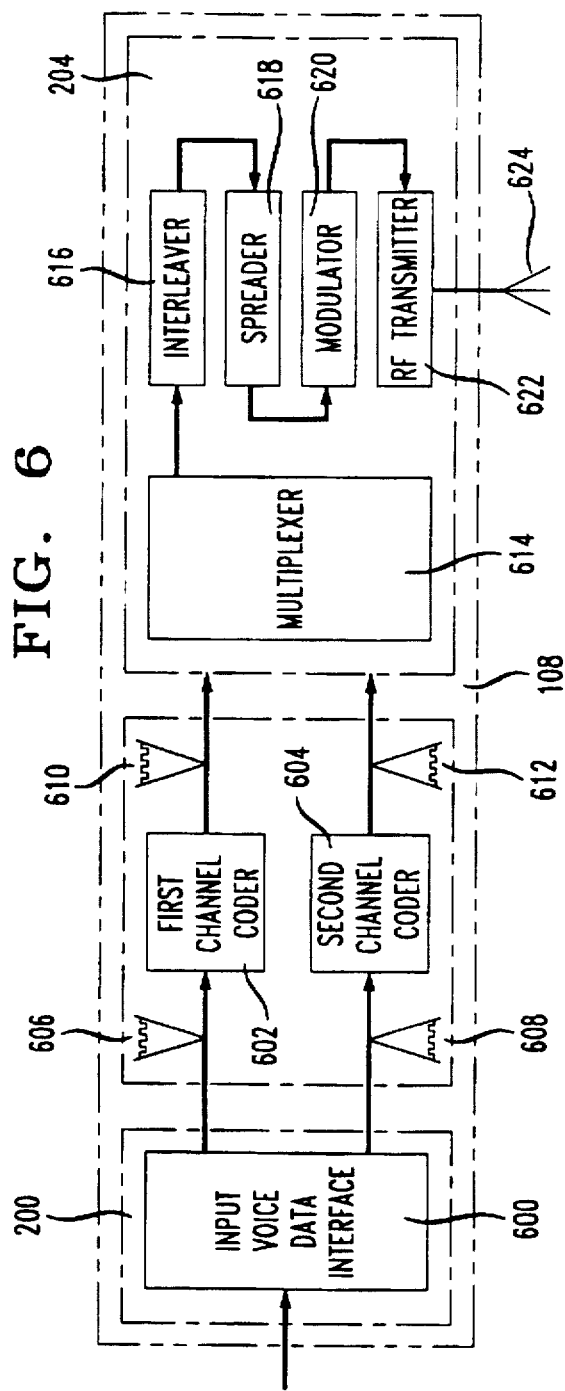
FIG. 6 presents a detailed block diagram of a second illustrative UEP DS-CDMA encoder made in accordance with the present invention.

FIG. 6 shows a detailed block diagram of a UEP-DS-CDMA transmitter 108 that may be used in with the VC CDMA method. The pre-processor 200, the UEP processor 202, and the post-processor 204 will be described in order with reference to FIG. 6.

Referring to FIG. 6, the pre-processor 200 comprises input voice data interface 600. The interface 600 separates the encoded voice data into two data streams, a first data stream 606 and a second data stream 608. Both the first data stream 606 and the second data stream 608 may, for example, be represented by a series of bits.

The UEP processor 202 comprises a first channel coder 602, and a second channel coder 604. The first data stream 606 is input into the first channel coder 602 and the second data stream 608 is input into the second channel coder 604. The first channel coder 602 and the second channel coder 604 operate to form a first channel coded data stream 610 and a second channel coded data stream 612, respectively.

In the preferred VC embodiment, the first channel coder 602 and the second channel coder 604 are different rate coders. This ensures that each bit within the first channel coded data stream 610 is represented within a first time portion and each bit within the second channel coded data stream 612 is represented within a second time portion. Each bit in the first channel coded data stream 610 and the second channel coded data stream 612 are of the same length. Each bit is also equal in length to $T_0$ (the basic time unit). Thus, the first channel coded data stream 610 and the second channel coded data stream 612 are represented in the same number of basic time units as the first data stream 606 and the second data stream 608.

The above example utilizes one half of the number of bits in the first coded signal 606 (e.g., the set of more significant bits) and one half of the number of bits in the second coded signal 608 (e.g., the set of less significant bits). A conventional rate ¼ coder is used to generate the first channel coded data stream 610 and a conventional rate ½ coder is used to generate the second channel coded data stream 612. Thus, in effect, the average rate for the entire signal (comprising the first data stream 606 and the second data stream 608) is ⅓.

The post-processor 204 takes, as its inputs, the first channel coded data stream 610 and the second channel coded data stream 612 and outputs an RF signal representing voice data input by the interface 600. The post-processor 204 comprises a multiplexer 614, an interleaver 616, a spreader 618, an modulator 620, an RF transmitter 622, and an antenna 624, all connected as shown. The multiplexer 614 functions to combine the first channel coded data stream 610 and the second channel coded data stream 612. The combined signal is interleaved by the interleaver 616 and spread by the spreader 618. The spread signal is modulated and transmitted via modulator 620, RF transmitter 622, and antenna 624, as is conventional.

FIGS. 7a through 7d show the first data stream 606, the second data stream 608, the first channel coded data stream 610 and the second channel coded data stream 612. In this example, the first channel coder 602 is a rate ¼ coder and the second channel coder 604 is a rate ½ coder. The outputs of these coders are shown in FIGS. 7c and 7d, respectively. Note that the total duration of the signals in FIGS. 7c and 7d equals the total duration of the signals in 7a and 7b. Thus, the VC UEP system, like the VT UEP system described above, also achieves UEP in a DS-CDMA environment. More specifically, this example achieves a "stretching" and "compressing" of bits in a different manner than the above described VT system.

Figure 7:
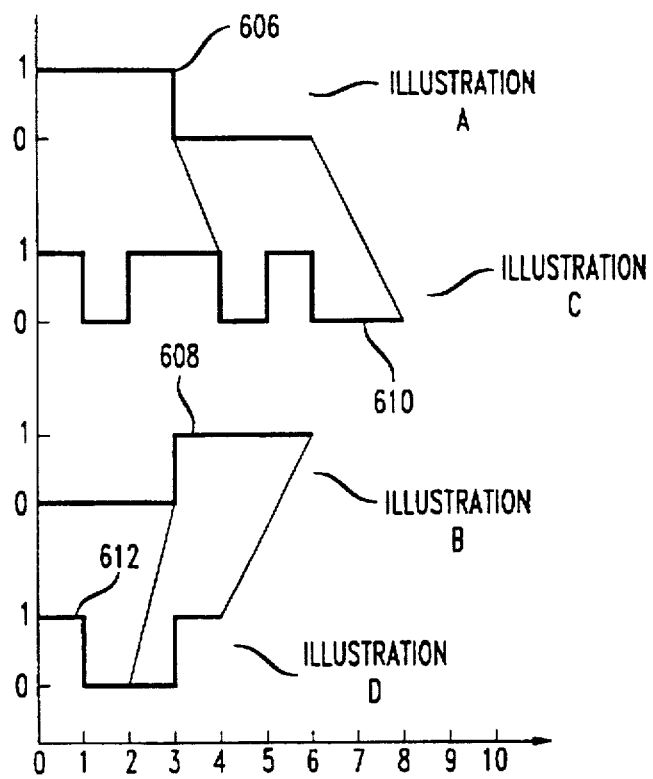
FIGS. 7a through 7d present how a signal may be processed by the UEP DS-CDMA encoder of FIG. 6.

The processing of the signal shown in FIG. 7 is only exemplary. One could accomplish UEP with the first channel coder 602 and the second channel coder 604 having the same code rate but different error correction capability (e.g., complexity).

Also, those skilled in the art will realize that one could:

(a) have more than two levels of significant bits (e.g., a first, second and third level of significance) wherein each level has a different amount of error protection provided to it;

(b) have the first channel coder 602 and the second channel coder 604 be any suitable combination of coders of different rates and not necessarily a rate ¼ coder and a rate ½, respectively;

(c) have any percentage of the bits (as opposed to 50% shown in FIG. 7) be deemed "more significant" depending upon the application and the capabilities of the interface 600;

(d) stretch (e.g., by the rate of the first channel coder) the more significant bits while leaving the less significant bits unchanged or compress the less significant bits (e.g., by the rate of the second channel coder) while leaving the more significant bits unchanged; and/or (e) combinations of the above that do not conflict such as "(c)" and "(d)."

Preferably, the interleaver 616 symbol length is the basic time unit and thus, the interleaver 616 operates upon each basic time unit of the signal shown in FIG. 7. However, those skilled in the art will realize that one could have the interleaver 616 operate on symbols wherein the symbol length is the length of:

(a) a chip and wherein the interleaving process performed by the interleaver 616 is performed subsequent to the spreading function of the spreader 322; and/or (b) a multiple integer of a chip or the basic time unit.

The output of the interleaver 616 goes into the spreader 618. The spreader 618 represents a typical spreader for DS-CDMA applications as described in the Gilhousen et al. article. The modulator 620, the RF transmitter 622, and the antenna 624 are also typical of such elements as described in the Gilhousen et al. article.

Preferably, the first channel coder 602 and the second channel coder 604 are coders based upon rate compatible punctured convolutinal ("RCPC") codes as described in J. Hagenauer, N. Seshadri, and C-E. W. Sundberg, "The performance of rate compatible punctured convolutional codes for digital mobile radio," IEEE Transactions on Communications 38(7), 966–980 (July, 1990). In this case, the corresponding decoders would also be based upon RCPC codes.

4. UEP-DS-CDMA Receiver: The VC method and device

FIG. 8 shows a block diagram of a UEP-DS-CDMA receiver 110. The UEP-DS-CDMA receiver 110 comprises a pre-processor 800, a UEP processor 802, and a post-processor 804.

Figure 9:
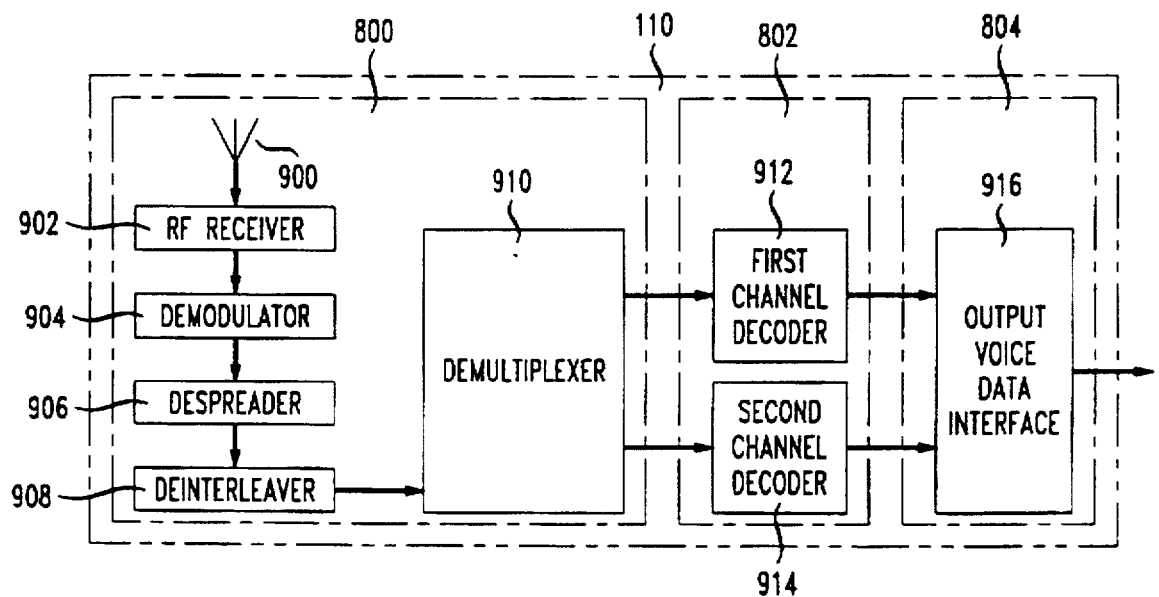
FIG. 9 shows a detailed block diagram of the UEP DS-CDMA decoder of FIG. 8.

Referring to FIG. 9, the pre-processor 800 comprises an antenna 900, an RF receiver 902, a demodulator 904, a despreader 906, a deinterleaver 908, and a demultiplexer 910, all connected as shown. The outputs of the demultiplexer 910 are input into the UEP processor 802. These are all conventional to the DS-CDMA coding art as described in the Gilhousen et al. article, with the exception of the demultiplexer 910. The demultiplexer 910 functions, in the above example, to separate the set of more significant time portions of the deinterleaved signal from the set of less significant portions of the deinterleaved signal. This results in analog values that form a series of soft decision values that are input into the UEP processor 802.

The UEP processor 802 comprises a first channel decoder 912 and a second channel decoder 914. These decoders, 912 and 914, receive, respectively, the series of soft decision values associated with the set of more significant portions of the deinterleaved signal and the series of soft decision values associated with the set of less significant portions of the deinterleaved signal. The series of soft decision values is processed with, preferably, a Viterbi decoder.

The post-processor 804 comprises an output voice data interface 916. The interface 916 receives its inputs from the first channel decoder 912 and the second channel decoder 914 and outputs a signal representative of voice.

Those skilled in the art will appreciate the variations that one must make in the receiver 110 depending upon variations made in the transmitter 108 (as described in section "3." above).

5. UEP-DS-CDNA Transmitter: The VP UEP method and device

The VP transmission method may be carried out in at least two basic embodiments. The first embodiment is shown in FIG. 10 and the second embodiment is described as a variation thereof.

Figure 10:
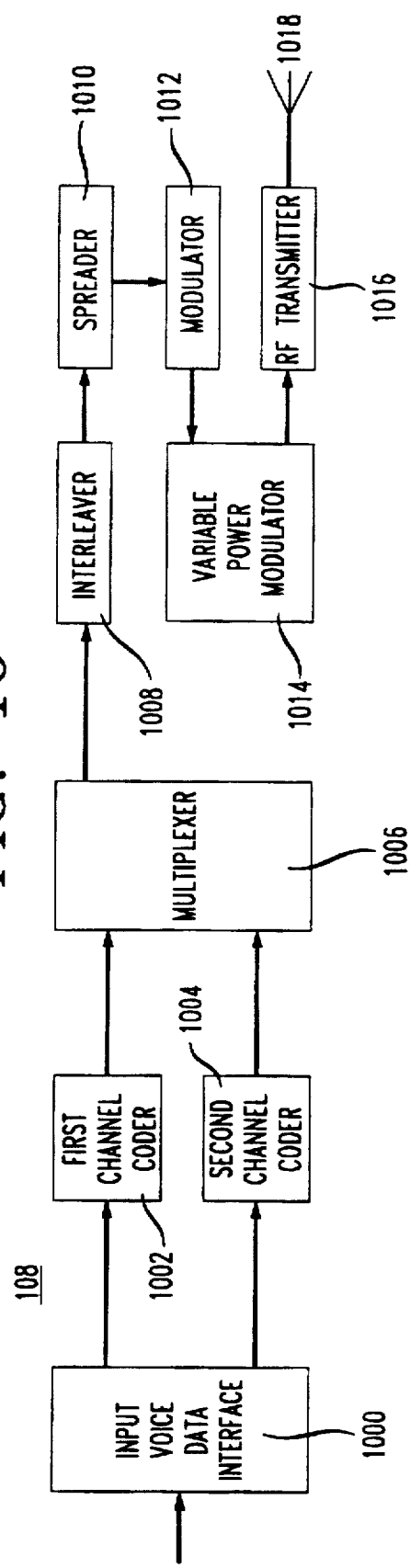
FIG. 10 shows a detailed block diagram of a third illustrative UEP DS-CDMA encoder made in accordance with the present invention.

Referring to FIG. 10, the VP transmitter comprises an input voice data interface 1000, a first channel coder 1002, a second channel coder 1004, a multiplexer 1006, an interleaver 1008, a spreader 1010, a modulator 1012, a variable power modulator 1014, an RF transmitter 1016, and an antenna 1018, all connected as shown. Essentially, the first channel coder 1002, the second channel coder 1004, and the multiplexer 1006 assist the signal from the interface 1000 to undergo UEP that will be provided by the variable power modulator 1014.

The variable power modulator 1014 has as its input a signal wherein each portion of the signal would be transmitted with the same amount of power if the signal were processed using standard DS-CDMA techniques. However, the variable power modulator 1014 adjusts the amplitude levels (e.g., providing amplitude modulation) of the more significant portions of the signal with respect to the amplitude levels of the less significant portions of the signal such that the power used to transmit the more significant portions of the signal in higher than the power used to transmit the less significant portions of the signal.

Preferably, the average transmitted power of the signal will be preserved so the power needed to transmit the signal will be the same as the average power that would have been needed without this UEP scheme. This is preferable because the average cochannel interference, which is related to the average transmitted power of interfering users, remains the same. The required power control operates on the average transmitted power for the VP technique.

While the preferred form of the VP device and technique have been described, those skilled in the art will realize that variations of the preferred form may include:

(a) using a first variable power modulator interposed between the first channel coder 1002 and the multiplexer 1006 and a second variable power modulator interposed between the second channel coder 1004 and the multiplexer 1006 in lieu of the variable power modulator 1014;

(b) using only one channel coder in lieu of the first channel coder 1002, the second channel coder 1004 and the multiplexer 1006;

(c) using no channel coder in lieu of the first channel coder 1002, the second channel coder 1004 and the multiplexer 1006; and/or (d) any combinations of the above that are compatible (e.g., "(a)" and "(b)").

6. UEP-DS-CDMA Receiver: The VP UEP method and device

Figure 11:
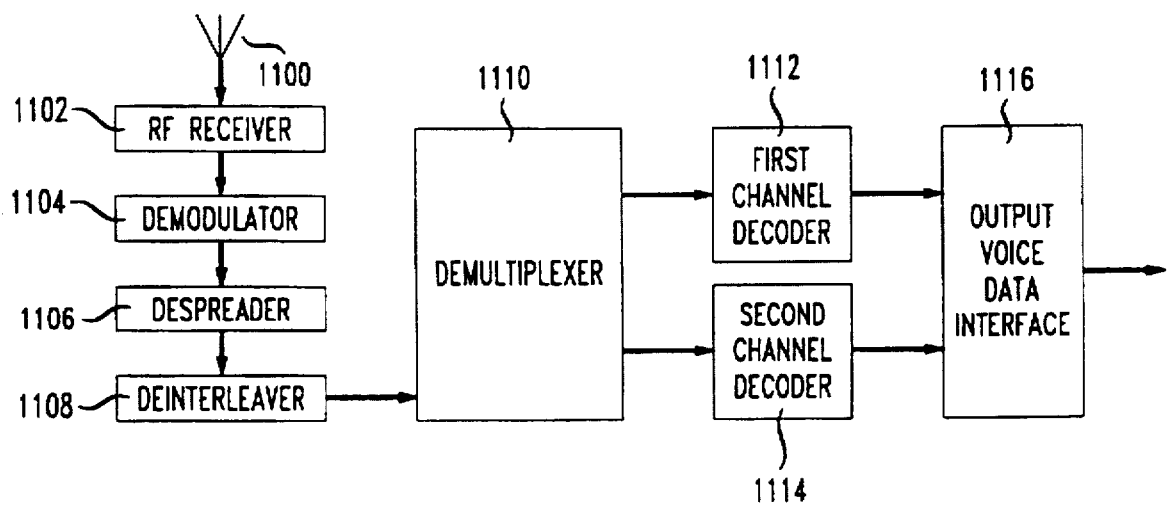
FIG. 11 shows a detailed block diagram of a third illustrative UEP DS-CDMA decoder that may be used in conjunction with the UEP DS-CDMA encoder of FIG. 10.

Referring to FIG. 11, the VP receiver comprises an antenna 1100, an RF receiver 1102, a demodulator 1104, a despreader 1106, a deinterleaver 1108, a demultiplexer 1110, a first channel decoder 1112, a second channel decoder 1114, and an output voice data interface 1116, all connected as shown.

In absence of any transmission impairment, the demodulator 1104 has as its input a signal wherein a first segment and a second segment of the signal have a higher and lower power level, respectively. This is due to the manner of transmission of the signal from the transmitter 108 as discussed in section "5." The UEP is obtained as a result of the variable power introduced in by the variable power modulator 1014 of the transmitter 108. The operation of the demultiplexer 1110, the first channel decoder 1112, and the second channel decoder 1114 provide a clear demarcation between the more significant bits and the less significant bits. This should be appreciated by those skilled in the art. Those skilled in the art will also appreciate the variations that one must make in the receiver 110 depending upon variations made in the transmitter 108 (as described in section "5." above).

7. UEP-DS-CDMA: Combinations of VT, VC, and VP methods

A number of different embodiments of achieving an UEP in a DS-CDMA system have been described above. These embodiments include VT, VC, and VP modulation/demodulation techniques. Those skilled in the art will realize that combinations of these techniques may be in a single system that also achieves UEP in a DS-CDMA system. For example, one could combine VP and VT techniques in a single system. Also, one could combine VP and VC techniques in a single system. Also, one could combine VC and VT techniques. Finally, one could combine VP, VC, and VT techniques.

Although a number of specific embodiments of this invention have been shown and described herein, it is to be understood that these embodiments are merely illustrative of the many possible specific arrangements which can be devised in application of the principles of the invention. Numerous and varied other arrangements can be devised in accordance with these principles by those of ordinary skill in the art without departing from the spirit and scope of the invention.

What we claim is:

1. A method of processing a signal comprising applying a spread spectrum coding process, the signal being a function of time, the improvement comprising:

modulating the signal to generate a modulated signal, the signal comprising a first segment and a second segment, the first segment being more significant than the second segment and comprising a first time portion of the signal, the second segment comprising a second time portion of the signal, the modulating increasing the duration of the first time portion relative to the duration of the second time portion and wherein the increase in the first time portion is substantially the same as the decrease in the second time portion.

2. The method of claim 1 further comprising spreading the modulated signal to generate a spread spectrum signal, the spreading comprising combining the modulated signal with a spreading signal.

3. The method of claim 1 further comprising:

(a) modulating a radio frequency carrier with a spread spectrum signal to generate a modulated radio frequency signal; and (b) transmitting the modulated radio frequency signal.

4. The method of claim 1 wherein the signal is generated by:

(a) receiving an analog voice signal at a transmitter;

(b) coding the analog voice signal to generate a digitized voice signal;

(c) applying a forward error correction code to the digitized voice signal to generate an intermediate signal; and (d) interleaving the intermediate signal to generate the signal.

5. The method of claim 4 wherein said interleaving comprises interleaving the intermediate signal based upon a basic time unit of the signal.

6. The method of claim 2 wherein said spreading comprises the use of an orthogonal spreading sequence.

7. The method of claim 1 wherein said applying the spread spectrum coding process comprises applying a code division multiple access coding process.

8. The method of claim 7 wherein said applying the code division multiple access coding process comprises applying a direct sequence code division multiple access coding process.

9. In a method including applying a spread spectrum decoding method to a signal, the signal being a function of time, the improvement comprising:

variable time demodulating the signal to generate a variable time demodulated signal, the signal comprising a first segment and a second segment, the first segment being more significant than the second segment and comprising a first time portion of the signal, the second segment comprising a second time portion of the signal, the variable time demodulating comprising increasing the duration of the second time portion relative to the first time portion, and wherein the increase in the second time portion is substantially the same as the decrease in the first time portion.

10. The method of claim 9 wherein said variable time demodulating comprises:
   (a) despreading the signal to generate a despread signal;
   (b) deinterleaving the despread signal to generate a deinterleaved signal; and
   (c) demultiplexing the deinterleaved signal to generate a first signal and a second signal.

11. The method of claim 10 further comprising:
   (a) generating a first series of soft decision values based upon the first signal; and
   (b) generating a second series of soft decision values based upon the second signal.

12. The method of claim 10 wherein said deinterleaving comprises deinterleaving the intermediate signal based upon a basic time unit of the signal.

13. The method of claim 9 where said applying a spread spectrum decoding method comprises applying a code division multiple access decoding process.

14. The method of claim 13 wherein the step of applying the code division multiple access decoding process comprises applying a direct sequence code division multiple access decoding process.

15. In an apparatus for processing a signal, the apparatus including means for applying a spread spectrum encoding process to the signal, the improvement comprising:
   means for applying a first error protection process to at least one more significant portion of the signal and a second error protection process to at least one less significant portion of the signal wherein the first error protection process provides a greater amount of error protection than the second error protection process, the means for applying comprising:
   (a) means for applying a variable time modulator; and
   (b) means for applying a variable rate coder.

16. The apparatus of claim 15 wherein the means for applying the spread spectrum encoding process comprises means for applying a code division multiple access coding process.

17. The apparatus of claim 16 wherein the means for applying the code division multiple access coding process comprises means for applying a direct sequence code division multiple access coding process.

18. In an apparatus for processing a signal, the apparatus including means for applying a spread spectrum encoding process to the signal, the improvement comprising:
   means for applying a first error protection process to at least one more significant portion of the signal and a second error protection process to at least one less significant portion of the signal wherein the first error protection process provides a greater amount of error protection than the second error protection process, the means for applying comprising:
   (a) means for applying a variable power modulator;
   (b) means for applying a variable time modulator; and
   (c) means for applying a variable rate coder.

19. The apparatus of claim 18 wherein the means for applying the spread spectrum encoding process comprises means for applying a code division multiple access coding process.

20. The apparatus of claim 19 wherein the means for applying the code division multiple access coding process comprises means for applying a direct sequence code division multiple access coding process.

21. In an apparatus for processing a signal, the apparatus including means for applying a spread spectrum decoding process to the signal, the improvement comprising:
   means for decoding at least one more significant portion of the signal using a first error protection decoding process and at least one less significant portion of the signal using a second error protection decoding process, the means for decoding comprising:
   (a) means for demultiplexing a signal to generate a first segment of the signal and a second segment of the signal, means for decoding the first segment with a first channel decoder, and means for decoding the second segment with the second channel decoder; and
   (b) means for applying a variable time demodulator.

22. The apparatus of claim 21 wherein the means for applying the spread spectrum decoding process comprises means for applying a code division multiple access decoding process.

23. The apparatus of claim 22 wherein the means for applying the code division multiple access decoding process comprises means for applying a direct sequence code division multiple access decoding process.

24. In an apparatus for processing a signal, the apparatus including means for applying a spread spectrum decoding process to the signal, the improvement comprising:
   means for decoding at least one more significant portion of the signal using a first error protection decoding process and at least one less significant portion of the signal using a second error protection decoding process, the means for decoding comprising:
   (a) means for demultiplexing a signal to generate a first segment of the signal and a second segment of the signal, means for decoding the first segment with a first channel decoder, and means for decoding the second segment with the second channel decoder; and
   (b) means for applying a variable rate decoder.

25. The apparatus of claim 24 wherein the means for applying the spread spectrum decoding process comprises means for applying a code division multiple access decoding process.

26. The apparatus of claim 25 wherein the means for applying the code division multiple access decoding process comprises means for applying a direct sequence code division multiple access decoding process.

27. In an apparatus for processing a signal, the apparatus including means for applying a spread spectrum decoding process to the signal, the improvement comprising:
   means for decoding at least one more significant portion of the signal using a first error protection decoding process and at least one less significant portion of the signal using a second error protection decoding process, the means for decoding comprising:
   (a) means for applying a variable time demodulator; and
   (b) means for applying a variable rate decoder.

28. The apparatus of claim 27 wherein the means for applying the spread spectrum decoding process comprises means for applying a code division multiple access decoding process.

29. The apparatus of claim 28 wherein the means for applying the code division multiple access decoding process comprises means for applying a direct sequence code division multiple access decoding process.

30. In an apparatus for processing a signal, the apparatus including means for applying a spread spectrum decoding process to the signal, the improvement comprising:

means for decoding at least one more significant portion of the signal using a first error protection decoding process and at least one less significant portion of the signal using a second error protection decoding process, the means for decoding comprising:
  (a) means for demultiplexing a signal to generate a first segment of the signal and a second segment of the signal, means for decoding the first segment with a first channel decoder, and means for decoding the second segment with the second channel decoder;
  (b) means for applying a variable time demodulator; and
  (c) means for applying a variable rate decoder.

31. The apparatus of claim 30 wherein the means for applying the spread spectrum decoding process comprises means for applying a code division multiple access decoding process.

32. The apparatus of claim 31 wherein the means for applying the code division multiple access decoding process comprises means for applying a direct sequence code division multiple access decoding process.

33. A method of processing a signal, comprising applying a spread spectrum encoding process to the signal, the improvement comprising:
  applying a first error protection process to at least one more significant portion of the signal and a second error protection process to at least one less significant portion of the signal wherein the first error protection process provides a greater amount of error protection than the second error protection process, the step of applying comprising:
  (a) applying a variable rate coder to the signal to generate an intermediate modulated signal; and
  (b) applying a variable time modulator to the intermediate modulated signal.

34. The method of claim 33 wherein the step of applying the spread spectrum encoding process comprises applying a code division multiple access coding process.

35. The method of claim 34 wherein the step of applying the code division multiple access coding process comprises applying a direct sequence code division multiple access coding process.

36. In a method of processing a signal, the method including the step of applying a spread spectrum decoding process to the signal, the improvement comprising:
  decoding at least one more significant portion of the signal using a first error protection decoding process and at least one less significant portion of the signal using a second error protection decoding process, the step of decoding comprising:
  (a) demultiplexing a signal to generate a first segment of the signal and a second segment of the signal, decoding the first segment with a first channel decoder, and decoding the second segment with the second channel decoder; and
  (b) applying a variable time demodulator.

37. The method of claim 36 wherein the step of applying the spread spectrum decoding process comprises applying a code division multiple access decoding process.

38. The method of claim 37 wherein the step of applying the code division multiple access decoding process comprises applying a direct sequence code division multiple access decoding process.

39. In a method of processing a signal, the method including the step of applying a spread spectrum decoding process to the signal, the improvement comprising:
  decoding at least one more significant portion of the signal using a first error protection decoding process and at least one less significant portion of the signal using a second error protection decoding process, the step of decoding comprising:
  (a) demultiplexing a signal to generate a first segment of the signal and a second segment of the signal, decoding the first segment with a first channel decoder, and decoding the second segment with the second channel decoder; and
  (b) applying a variable rate decoder.

40. The method of claim 39 wherein the step of applying the spread spectrum decoding process comprises applying a code division multiple access decoding process.

41. The method of claim 40 wherein the step of applying the code division multiple access decoding process comprises applying a direct sequence code division multiple access decoding process.

42. In a method of processing a signal, the method including applying a spread spectrum decoding process to the signal, the improvement comprising:
  decoding at least one more significant portion of the signal using a first error protection decoding process and at least one less significant portion of the signal using a second error protection decoding process, the step of decoding comprising:
  (a) applying a variable time demodulator; and
  (b) applying a variable rate decoder.

43. The method of claim 42 wherein the step of applying the spread spectrum decoding process comprises applying a code division multiple access decoding process.

44. The method of claim 1 wherein the step of applying the code division multiple access decoding process comprises applying a direct sequence code division multiple access decoding process.

* * * * *